United States Patent
Han

(10) Patent No.: US 11,527,290 B2
(45) Date of Patent: Dec. 13, 2022

(54) METHOD OF PROGRAMMING NONVOLATILE MEMORY DEVICE INCLUDING REVERSIBLE RESISTANCE DEVICE

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/369,890

(22) Filed: Jul. 7, 2021

(65) Prior Publication Data
US 2022/0254413 A1    Aug. 11, 2022

(30) Foreign Application Priority Data
Feb. 5, 2021    (KR) .................. 10-2021-0017100

(51) Int. Cl.
| | | |
|---|---|---|
| *G11C 11/00* | (2006.01) | |
| *G11C 13/00* | (2006.01) | |
| *H01L 45/00* | (2006.01) | |
| *H01L 43/02* | (2006.01) | |
| *G11C 11/16* | (2006.01) | |

(52) U.S. Cl.
CPC ........ *G11C 13/0069* (2013.01); *G11C 13/003* (2013.01); *G11C 13/004* (2013.01); *G11C 13/0064* (2013.01); *H01L 45/1233* (2013.01); *G11C 11/1659* (2013.01); *G11C 11/1673* (2013.01); *G11C 11/1675* (2013.01); *G11C 11/1677* (2013.01); *G11C 13/0004* (2013.01); *H01L 43/02* (2013.01)

(58) Field of Classification Search
CPC . G11C 13/0069; G11C 13/003; G11C 13/004; G11C 13/0064
USPC .......................................................... 365/148
See application file for complete search history.

(56) References Cited

U.S. PATENT DOCUMENTS

| | | | | |
|---|---|---|---|---|
| 9,837,153 | B1 * | 12/2017 | Rajamohanan | .... G11C 13/0002 |
| 2012/0120710 | A1 * | 5/2012 | Rabkin | .............. G11C 13/0007 365/148 |
| 2013/0201750 | A1 * | 8/2013 | Lee | ..................... G11C 13/0064 365/148 |

FOREIGN PATENT DOCUMENTS

| | | |
|---|---|---|
| KR | 20100046757 A | 5/2010 |
| KR | 20140127577 A | 11/2014 |

\* cited by examiner

*Primary Examiner* — Vu A Le

(57) ABSTRACT

A method of programming a nonvolatile memory device including a plurality of memory cells is provided. Each of the plurality of memory cells includes a reversible resistance device. A target memory cell is selected from among the plurality of memory cells. A target resistance state for the reversible resistance device of the target memory cell is determined. A resistance state of the reversible resistance device of the target memory cell is read. The read resistance state is compared with the target resistance state. One of a positive program operation and a negative program operation is performed for the reversible resistance device of the target memory cell when the read resistance state is different from the target resistance state.

21 Claims, 11 Drawing Sheets

METHOD OF PROGRAMMING NONVOLATILE MEMORY DEVICE INCLUDING REVERSIBLE RESISTANCE DEVICE

CROSS-REFERENCE TO RELATED APPLICATIONS

The present application claims priority under 35 U.S.C. § 119(a) to Korean Application No. 10-2021-0017100, filed on Feb. 5, 2021 in the Korean Intellectual Property Office, which is incorporated herein by reference in its entirety.

BACKGROUND

1. Technical Field

The present disclosure generally relates to a programming method for a nonvolatile memory device.

2. Related Art

Various processes and operations may be applied to methods of writing signal information in a nonvolatile memory device according to a configuration of the nonvolatile memory device. In a case of a flash memory device, which is an example of a nonvolatile memory device, methods related to writing signal information may include a program operation of storing electrons in a charge storage layer of a memory cell and an erase operation that erases electrons from the charge storage layer. The program operation and the erase operation may be performed by applying a program voltage and an erase voltage to a gate electrode of the memory cell, respectively, to change the electron density in the charge storage layer.

Nonvolatile memory devices may be resistance-change memory devices that include a reversible resistance device. In a resistance change memory device with reversible resistance, a write operation of signal information may be performed by changing the electrical resistance of the reversible resistance device inside the memory cell. The signal information write operation of the resistance-change memory device may be differentiated from program operations or erase operations of flash memory devices in which electrons are filled in or erased from the charge storage layer. Recently, with increasing industry interest in the use of the resistance change memory devices, various methods for effectively writing signal information in a plurality of memory cells of resistance-change memory devices have been studied.

SUMMARY

A method of programming a nonvolatile memory device according to an embodiment of the present disclosure is provided. In the programming method, a memory device including a plurality of memory cells may be provided. Each of the plurality of memory cells may include a reversible resistance device. A target memory cell may be selected from among the plurality of memory cells. A target resistance state for the reversible resistance device of the target memory cell may be determined. A resistance state of the reversible resistance device of the target memory cell may be read. The read resistance state may be compared with the target resistance state. One of a positive program operation and a negative program operation may be performed for the reversible resistance device of the target memory cell when the read resistance state may be different from the target resistance state. The positive program may include applying a program voltage having a positive polarity to the reversible resistance device of the target memory cell, and the negative program may include applying a program voltage having a negative polarity to the reversible resistance device of the target memory cell.

A method of programming a nonvolatile memory device according to another embodiment of the present disclosure is provided. In the programming method, a memory element including a plurality of memory cells connected in series along a channel layer extending in a direction perpendicular to an upper surface of a substrate may be provided. Each of the plurality of memory cells may include a reversible resistance memory layer and a gate electrode layer that are disposed adjacent to side surfaces of the channel layer. A target memory cell may be selected from among the plurality of memory cells and a target resistance state for the reversible resistance memory layer of the target memory cell may be determined. A resistance state may be read by measuring an operation current flowing through the reversible resistance memory layer of the target memory cell. The read resistance state may be compared with the target resistance state. One of a positive program operation and a negative program operation for the reversible resistance memory layer of the target memory cell may be performed to change the resistance state of the reversible memory layer when the read resistance state is different from the target resistance state.

DETAILED DESCRIPTION

Figure 1:
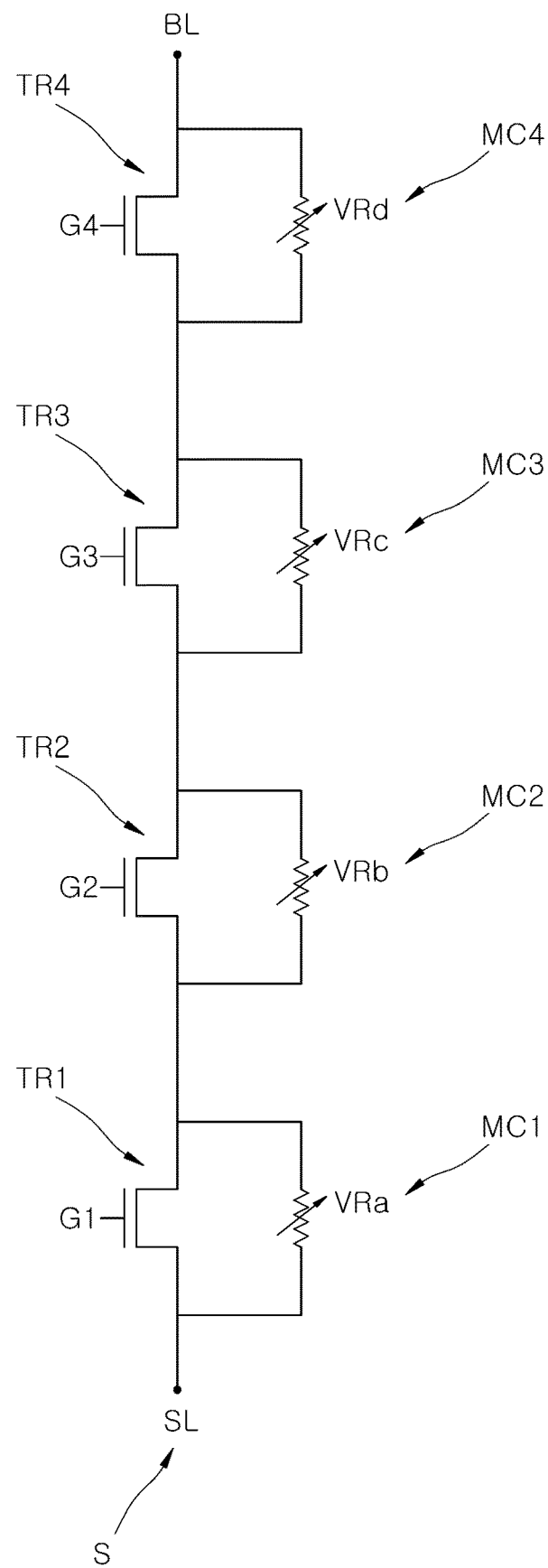
FIG. 1 is a circuit diagram of a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise" or "have" are intended to specify the presence of a feature, a number, a step, an operation, a component, a device, a part, or combinations thereof, but not used to preclude the presence or possibility of addition one or more other features, numbers, steps, operations, components, devices, parts, or combinations thereof.

In this specification, the term "a predetermined direction" may mean a direction encompassing a direction determined in a coordinate system and a direction opposite to the direction. As an example, in the x-y-z coordinate system, the x-direction may encompass a direction parallel to the x-axis. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Embodiments of the present disclosure provide a method of reliably performing a program operation on a reversible resistance device of a memory cell in a nonvolatile memory device that includes the memory cell and its reversible resistance device. The memory cell may non-volatilely store different electrical resistance states in the reversible resistance device through the application of a program voltage. The nonvolatile memory device of the present disclosure may be a memory device that utilizes a resistance-change characteristic of the reversible resistance device to store signal information.

FIG. 1 is a circuit diagram of a nonvolatile memory device according to an embodiment of the present disclosure. Referring to FIG. 1, a nonvolatile memory device 1 may include first to fourth memory cells MC1, MC2, MC3, and MC4 connected in series with each other. The first to fourth memory cells MC1, MC2, MC3, and MC4 may form a string S between a source line SL and a bit line BL. The first to fourth memory cells MC1, MC2, MC3, and MC4 may include corresponding first to fourth transistor devices TR1, TR2, TR3, and TR4 and first to fourth reversible resistance devices VRa, VRb, VRc, and VRd, respectively. The first to fourth reversible resistance devices VRa, VRb, VRc, and VRd may be connected in parallel to the corresponding first to fourth transistor devices TR1, TR2, TR3, and TR4, respectively.

The first to fourth transistor devices TR1, TR2, TR3, and TR4 may include corresponding first to fourth gate electrodes G1, G2, G3, and G4, respectively. Each of the first to fourth gate electrodes G1, G2, G3, and G4 may be connected to different word lines (not illustrated). When a gate voltage greater than or equal to a threshold voltage is applied to the first to fourth gate electrodes G1, G2, G3, and G4, the first to fourth transistor devices TR1, TR2, TR3, and TR4 may be turned on to form a conductive channel under the first to fourth gate electrodes G1, G2, G3, and G4, respectively. That is, each of the first to fourth transistor devices TR1, TR2, TR3, and TR4 may perform a threshold switching operation controlled by the gate voltage applied to the first to fourth gate electrodes G1, G2, G3, and G4, respectively.

Each of the first to fourth reversible resistance devices VRa, VRb, VRc, and VRd may have an electrical resistance that is reversibly changed by a program voltage applied to opposite ends of each of the first to fourth reversible resistance devices VRa, VRb, VRc, and VRd. After the program voltage is removed, the changed electrical resistance may be non-volatilely stored in each of the first to fourth reversible resistance devices VRa, VRb, VRc, and VRd. That is, the first to fourth reversible resistance devices VRa, VRb, VRc, and VRd may perform a memory function of storing different electrical resistances respectively in a non-volatile manner. In an embodiment, each of the first to fourth reversible resistance devices VRa, VRb, VRc, and VRd may be a phase change random access memory (PCRAM) device, a resistive random access memory (ReRAM) device, or a magnetic random access memory (MRAM) device.

In an embodiment, each of the first to fourth reversible resistance devices VRa, VRb, VRc, and VRd may perform a function of storing single-level information. That is, each of the first to fourth reversible resistance devices VRa, VRb, VRc, and VRd may store two different electrical resistances that correspond to one (1) bit of signal information. In another embodiment, each of the first to fourth reversible resistance devices VRa, VRb, VRc, and VRd may perform a function of storing multi-level information. That is, each of the first to fourth reversible resistance devices VRa, VRb, VRc, and VRd may store a plurality of different electrical resistances that corresponds to signal information of two (2) bits or more. As an example, each of the first to fourth reversible resistance devices VRa, VRb, VRc, and VRd may store four different electrical resistances corresponding to 2-bit signal information. As another example, each of the first to fourth reversible resistance devices VRa, VRb, VRc, and VRd may store eight different electrical resistances corresponding to 3-bit signal information.

Figure 2:
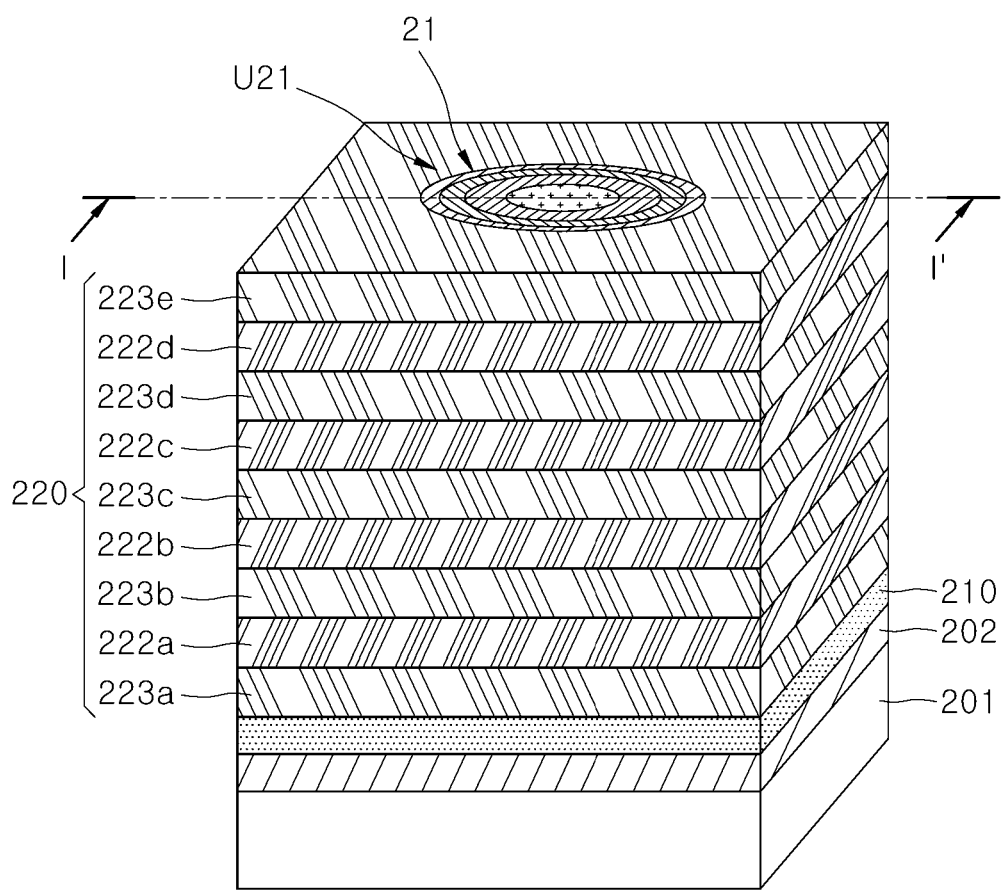
FIG. 2 is a perspective view schematically illustrating a nonvolatile memory device according to an embodiment of the present disclosure.
Figure 3:
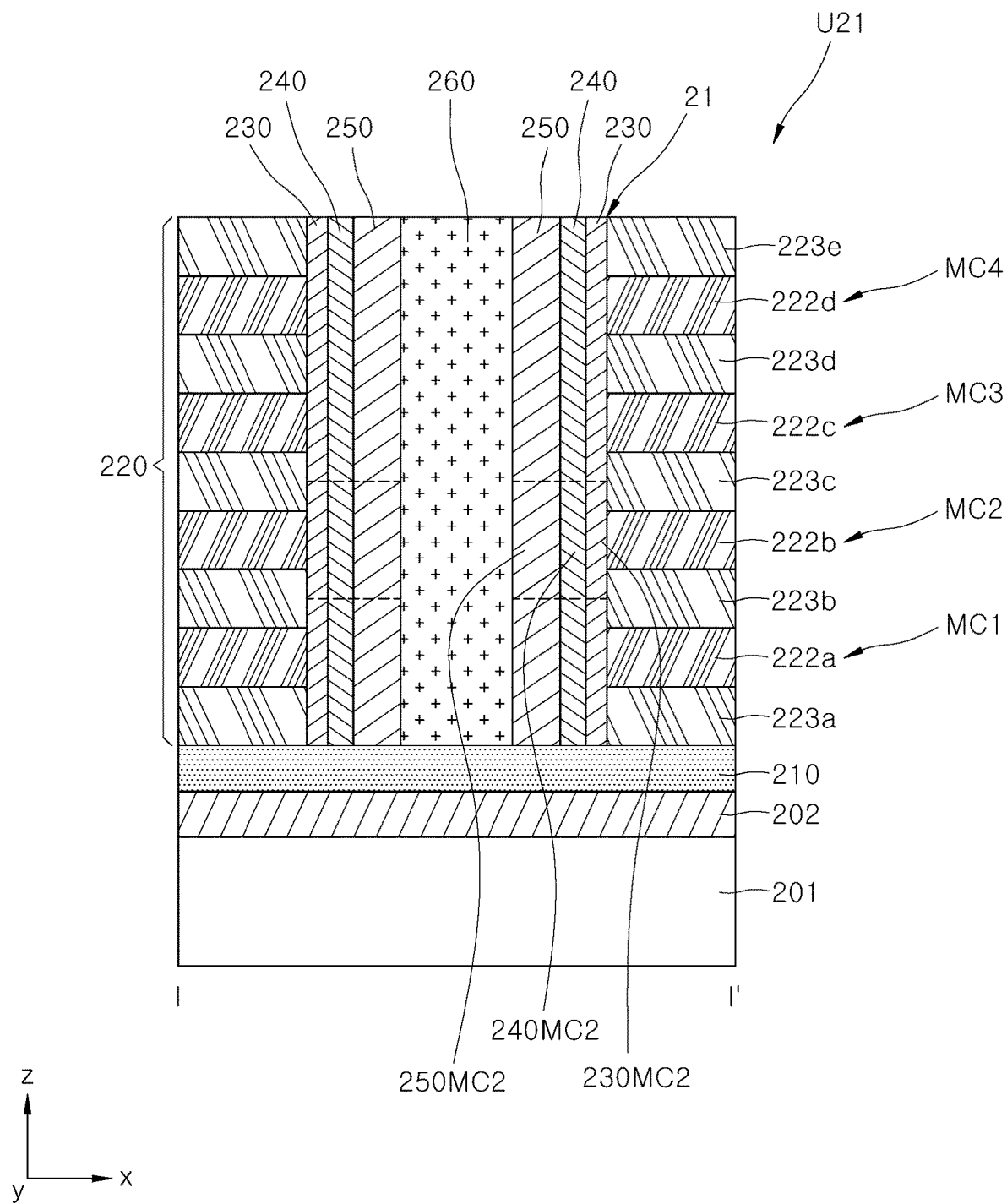
FIG. 3 is a cross-sectional view taken along a line I-I' of the nonvolatile memory device of FIG. 2.

FIG. 2 is a perspective view schematically illustrating a nonvolatile memory device according to an embodiment of the present disclosure. FIG. 3 is a cross-sectional view taken along a line I-I' of the nonvolatile memory device of FIG. 2. A nonvolatile memory device 2, as illustrated by FIGS. 2 and 3, may be an implementation of the circuit diagram of FIG. 1. The nonvolatile memory device 2 may include resistance change memory devices corresponding to reversible resistance devices VRa, VRb, VRc and VRd illustrated in FIG. 1.

Referring to FIGS. 2 and 3, the nonvolatile memory device 2 may include a substrate 201 and a gate structure 220 disposed over the substrate 201. In addition, the nonvolatile memory device 2 may include a hole pattern 21 penetrating the gate structure 220 over the substrate 201. The nonvolatile memory device 2 may include a gate insulating layer 230, a channel layer 240, and a reversible resistance memory layer 250, which sequentially cover a sidewall surface of the gate structure 220 within the hole pattern 21.

In addition, the nonvolatile memory device 2 may include a base insulating layer 202 and a channel lower contact layer 210, which are disposed between the substrate 201 and the gate structure 220. The channel lower contact layer 210 may contact an end of the channel layer 240. Although not illustrated in FIGS. 2 and 3, the nonvolatile memory device 2 may include a channel upper contact layer over the gate structure 220 and in contact with the other end of the channel layer 240. The nonvolatile memory device 2 may include a filling insulating layer 260 that fills the remainder of hole pattern 21 in which the gate insulating layer 230, the channel layer 240, and the reversible resistance memory layer 250 are disposed.

Referring to FIGS. 2 and 3, the substrate 201 provided may include a semiconductor material. The base insulating layer 202 may be disposed on the substrate 201. The base insulating layer 202 may electrically insulate the channel lower contact layer 210 from the substrate 201. The base insulating layer 202 may include an insulating material.

Although not illustrated, an integrated circuit may be disposed between the substrate 201 and the base insulating layer 202. The integrated circuit may include a circuit for driving and controlling a plurality of memory cells of the nonvolatile memory device 2.

The channel lower contact layer 210 may be disposed on the base insulating layer 202. The channel lower contact layer 210 may be electrically connected to the channel layer 240. Although not illustrated, the channel lower contact layer 210 may be electrically connected to a source line. The channel lower contact layer 210 may include a conductive material.

The gate structure 220 may be disposed on the channel lower contact layer 210. The gate structure 220 may include first to fourth gate electrode layers 222a, 222b, 222c, and 222d and first to fifth interlayer insulating layers 223a, 223b, 223c, 223d, and 223e. The gate electrode layers and the interlayer insulating layers may be alternately stacked along a first direction (i.e., z-direction) perpendicular to an upper surface of the substrate 201. As illustrated in FIGS. 2 and 3, the first to fourth gate electrode layers 222a, 222b, 222c, and 222d may be disposed adjacent to the channel layer 240 or the gate insulating layer 230. The first interlayer insulating layer 223a may be disposed to contact the channel lower contact layer 210. The fifth interlayer insulating layer 223e may be disposed as an uppermost layer of the gate structure 220. Each of the first to fourth gate electrode layers 222a, 222b, 222c, and 222d may include a conductive material. Each of the first to fifth interlayer insulating layers 223a, 223b, 223c, 223d, and 223e may include an insulating material.

The number of the gate electrode layers of the gate structure 220 is not limited to four. In embodiments, the gate electrode layers may be disposed in different numbers, and the interlayer insulating layers may insulate the various numbers of gate electrode layers from each other along the first direction (i.e., z-direction).

Referring to FIGS. 2 and 3, the hole pattern 21 may be formed to penetrate through the gate structure 220 in the first direction to expose the channel lower contact layer 210. As an example, the hole pattern 21 may be formed by lithography and etching processes.

The gate insulating layer 230 covering a sidewall surface of the gate structure 220 may be disposed inside the hole pattern 21. The gate insulating layer 230 may include an insulating material. The channel layer 240 may be disposed on the gate insulating layer 230 in a lateral direction. The channel layer 240 may extend in the first direction (i.e., z-direction) inside the hole pattern 21. That is, the channel layer 240 may be disposed along a sidewall surface of the gate structure 220. The channel layer 240 may include a semiconductor material. The channel layer 240 may be doped with a dopant to have electrical conductivity.

The reversible resistance memory layer 250 may be disposed on a sidewall surface of the channel layer 240. The reversible resistance memory layer 250 may extend in the first direction (i.e., z-direction) inside the hole pattern 21. That is, the reversible resistance memory layer 250 may be disposed to contact the channel layer 240 along a sidewall surface of the gate structure 220.

An electrical resistance state of the reversible resistance memory layer 250 may be variably changed according to the polarity or magnitude of a voltage applied to the reversible resistance memory layer 250. In addition, after the applied voltage is removed, the changed electrical resistance state may be non-volatilely stored in the reversible resistance memory layer 250. As an example, the reversible resistance memory layer 250 may have two or more different resistance states, and the reversible resistance memory layer 250 may non-volatilely store one of the two or more different resistance states. In other words, the reversible resistance memory layer 250 may have two or more electrical resistance values depending on the polarity or magnitude of the voltage applied to the layer.

The reversible resistance memory layer 250 may include a resistance-change material. The resistance-change material may have movable oxygen vacancies or movable metal ions. An oxygen vacancy may have a positive charge. A metal ion may be a cation having a positive charge or an anion having a negative charge. The resistance-change material may include, for example, titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. In other embodiments, the resistance-change material may include PCMO ($Pr_{1-x}Ca_xMnO_3$, $0<x<1$), LCMO ($La_{1-x}Ca_xMnO_3$, $0<x<1$), BSCFO ($Ba_{0.5}Sr_{0.5}Co_{0.8}Fe_{0.2}O_{3-\delta}$), YBCO ($YBa_2Cu_3O_{7-x}$, $0<x<1$), (Ba, Sr)$TiO_3$ doped with chromium or niobium, $SrZrO_3$ doped with chromium or vanadium, (La, Sr)$MnO_3$, $Sr_{1-x}La_xTiO_3$($0<x<1$), $La_{1-x}Sr_xFeO_3$($0<x<1$), $La_{1-x}Sr_xCoO_3$($0<x<1$), $SrFeO_{2.7}$, $LaCoO_3$, $RuSr_2GdCu_2O_3$, $YBa_2Cu_3O_7$, or a combination of two or more thereof. The resistance-change material may include, for example, germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $Ge_xSe_{1-x}$ ($0<x<1$), silver sulfide ($Ag_2S$), copper sulfide ($Cu_2S$), cadmium sulfide (CdS), zinc sulfide (ZnS), and selenium oxide ($CeO_2$), or a combination of two or more thereof.

Meanwhile, the filling insulating layer 260 may be disposed inside the hole pattern 21 in which the gate insulating layer 230, the channel layer 240, and the reversible resistance memory layer 250 are formed. The filling insulating layer 260 may include an insulating material.

Although not illustrated in FIGS. 2 and 3, the channel upper contact layer in contact with the channel layer 240 may be disposed on the gate structure 220. The channel upper contact layer may be electrically connected to a bit line (not illustrated). The channel upper contact layer may include a conductive material. The channel upper contact layer may be made of the same material as the channel lower contact layer 210.

Referring to FIGS. 2 and 3, the nonvolatile memory device 2 may include an operation unit U21 in which the first to fourth memory cells MC1, MC2, MC3, and MC4 are connected in series with each other. The operation unit U21 may correspond to the string S in FIG. 1. That is, the first to fourth memory cells MC1, MC2, MC3, and MC4 illustrated in FIG. 3 may correspond to the first to fourth memory cells MC1, MC2, MC3, and MC4 of the circuit diagram in FIG. 1.

As an example, the second memory cell MC2 may include a transistor device including a second gate electrode layer 222b, a portion 230MC2 of the gate insulating layer 230 that can be electrically controlled by or through the second gate electrode layer 222b, and a portion 240MC2 of the channel layer 240 that can be electrically controlled by or through the second gate electrode layer 222b. The transistor device may correspond to the second transistor device TR2 of the circuit diagram in FIG. 1. In addition, the second memory cell MC2 may include a portion 250MC2 of the reversible resistance memory layer 250 adjacent to the portion 240MC2 of the channel layer 240. The portion 250MC2 of the reversible resistance memory layer 250 may function as a reversible resistance device of the second memory cell MC2. The portion 250MC2 of the reversible resistance memory layer 250 may correspond to the second reversible resistance device VRb of the circuit diagram in FIG. 1.

Similarly, the first memory cell MC1, the third memory cell MC3, and the fourth memory cell MC4 illustrated in FIG. 3 may be provided with corresponding transistor devices and reversible resistance devices in substantially the same manner as the second memory cell MC2. That is, the first memory cell MC1, the third memory cell MC3, and the fourth memory cell MC4 may include a first gate electrode layer 222a, a third gate electrode layer 222c, and a fourth gate electrode layer 222d, respectively. In addition, the first memory cell MC1, the third memory cell MC3, and the fourth memory cell MC4 may include portions of the gate insulating layer 230 and portions of the channel layer 240 electrically controlled by or through the first gate electrode layer 222a, the third gate electrode layer 222c, and the fourth gate electrode layer 222d, respectively. Furthermore, each of the first memory cell MC1, the third memory cell MC3, and the fourth memory cell MC4 may include a portion of the reversible resistance memory layer 250 adjacent to a portion of the corresponding channel layer 240 controlled by or through respective portions of the gate electrode layer.

Figure 4:
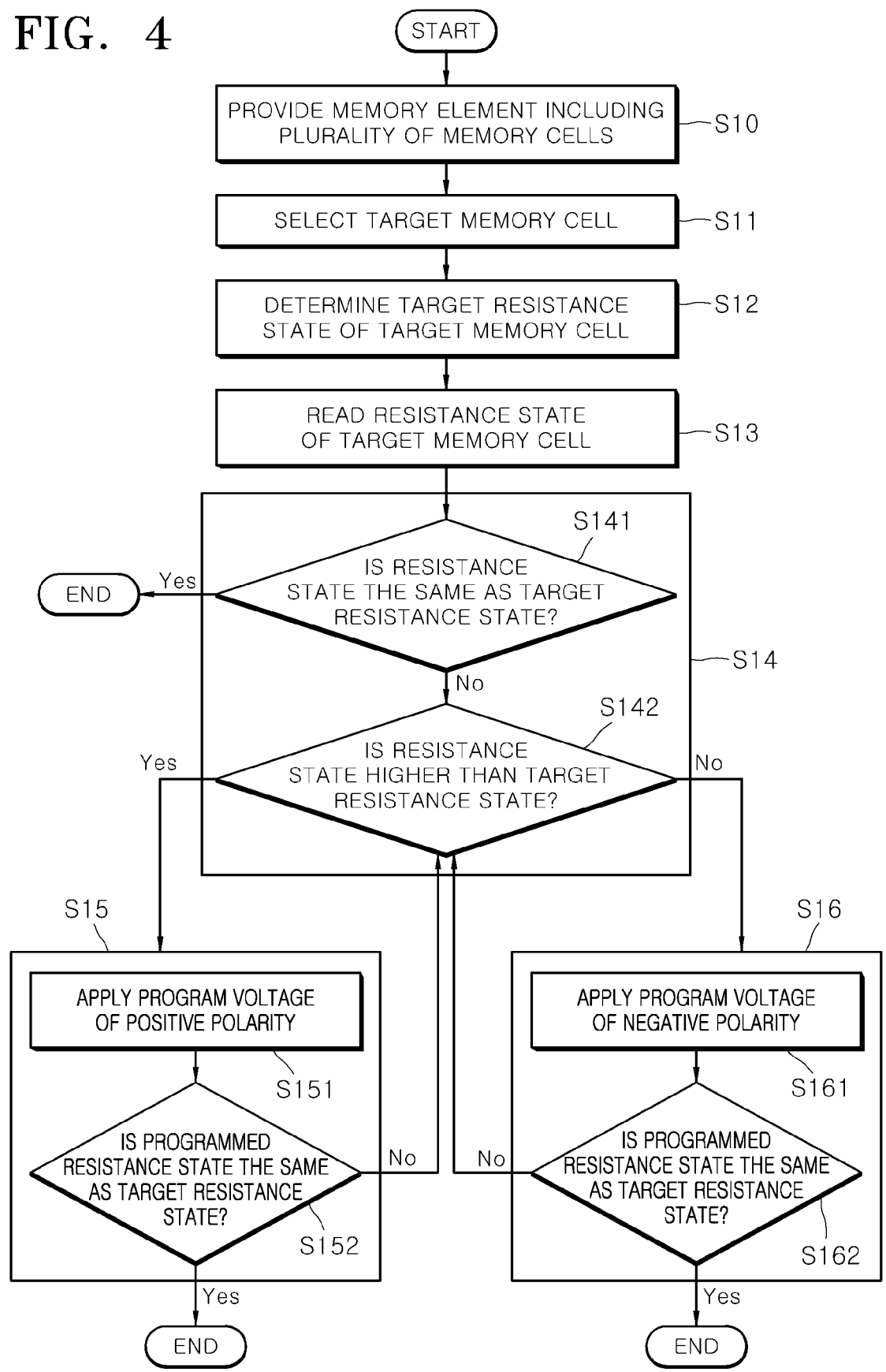
FIG. 4 is a flowchart schematically illustrating a program operation of a nonvolatile memory device according to an embodiment of the present disclosure.
Figure 5:
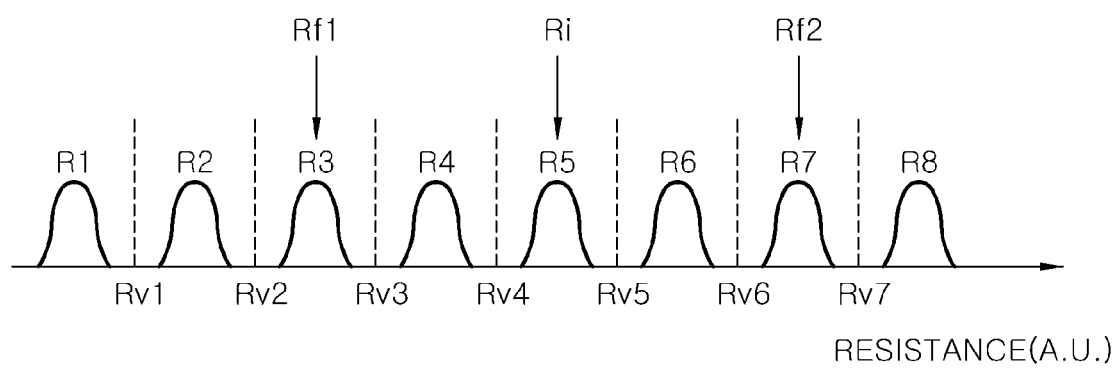
FIG. 5 is a view illustrating an example of signal information stored in a nonvolatile memory device by a program operation according to an embodiment of the present disclosure.
Figure 6A:
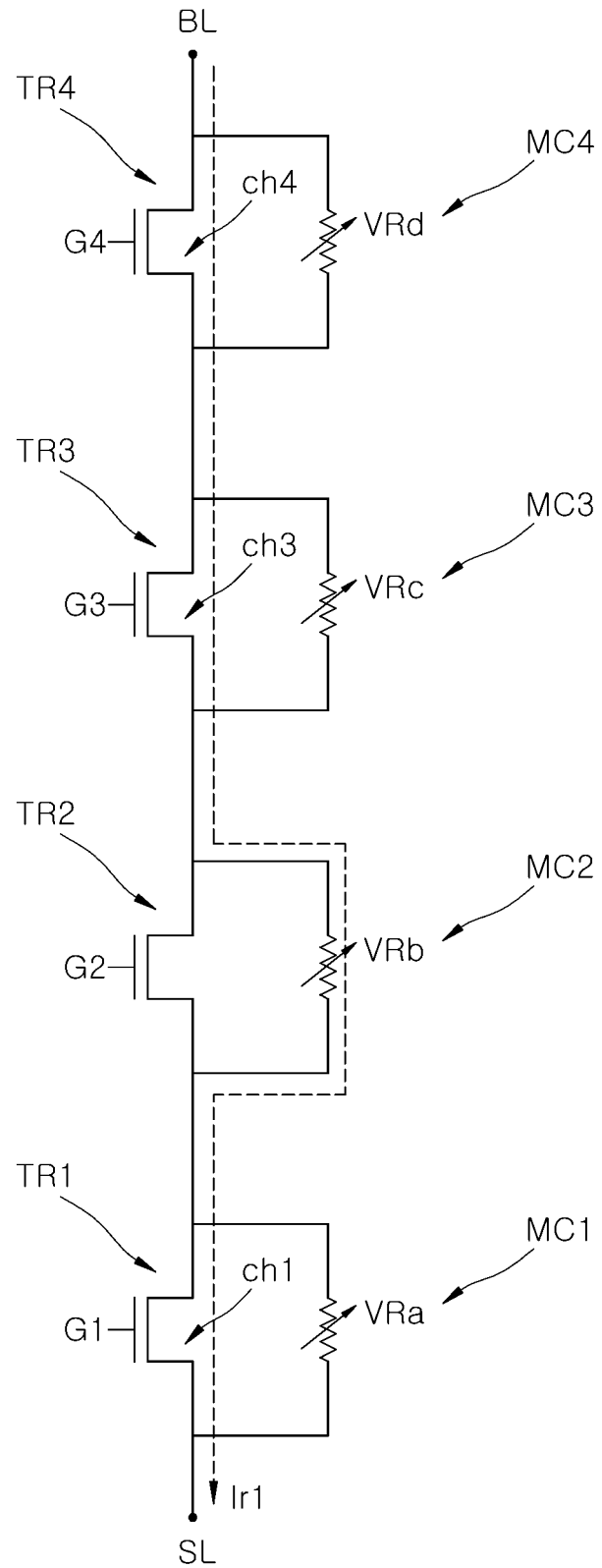
FIGS. 6A and 6B are views schematically illustrating a read operation of a nonvolatile memory device according to an embodiment of the present disclosure.
Figure 6B:
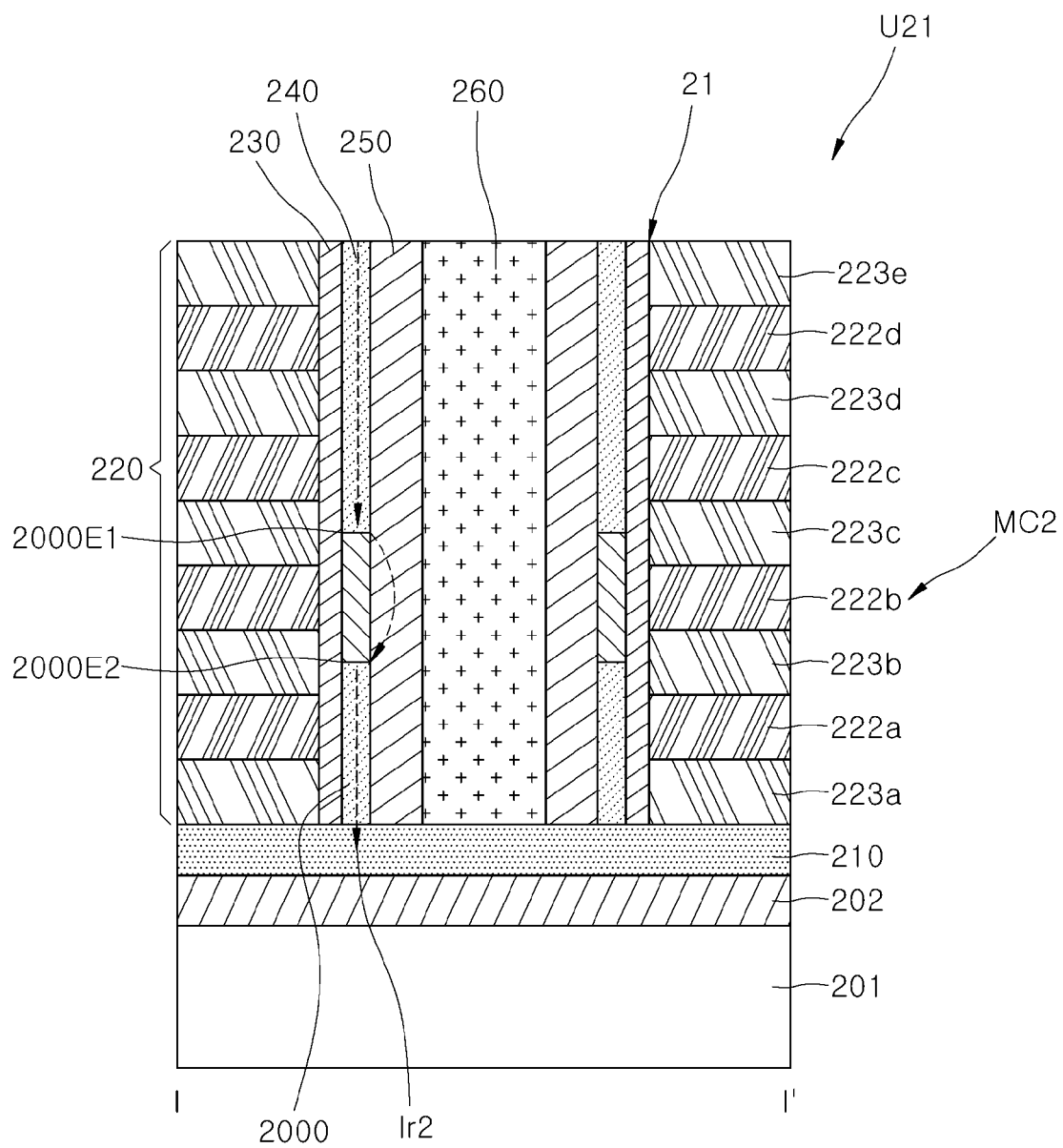
Figure 7A:
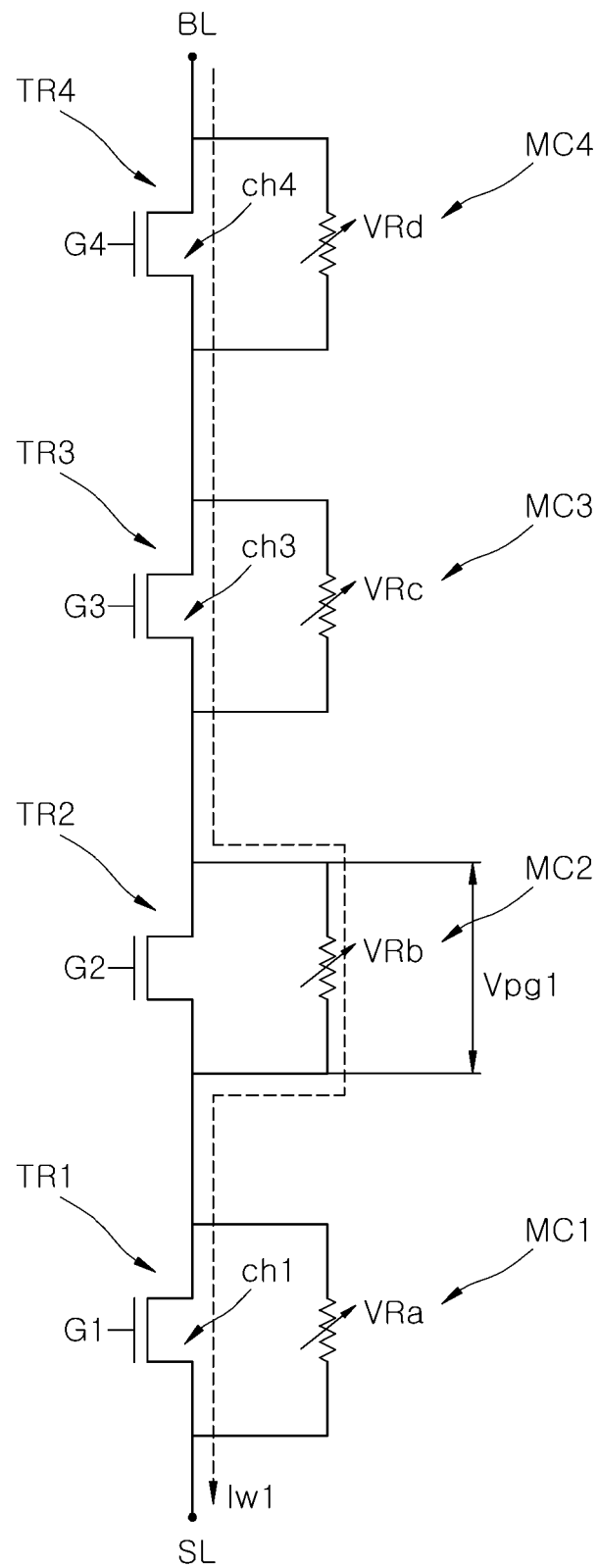
FIGS. 7A and 7B are views schematically illustrating a program operation of a nonvolatile memory device according to an embodiment of the present disclosure.
Figure 7B:
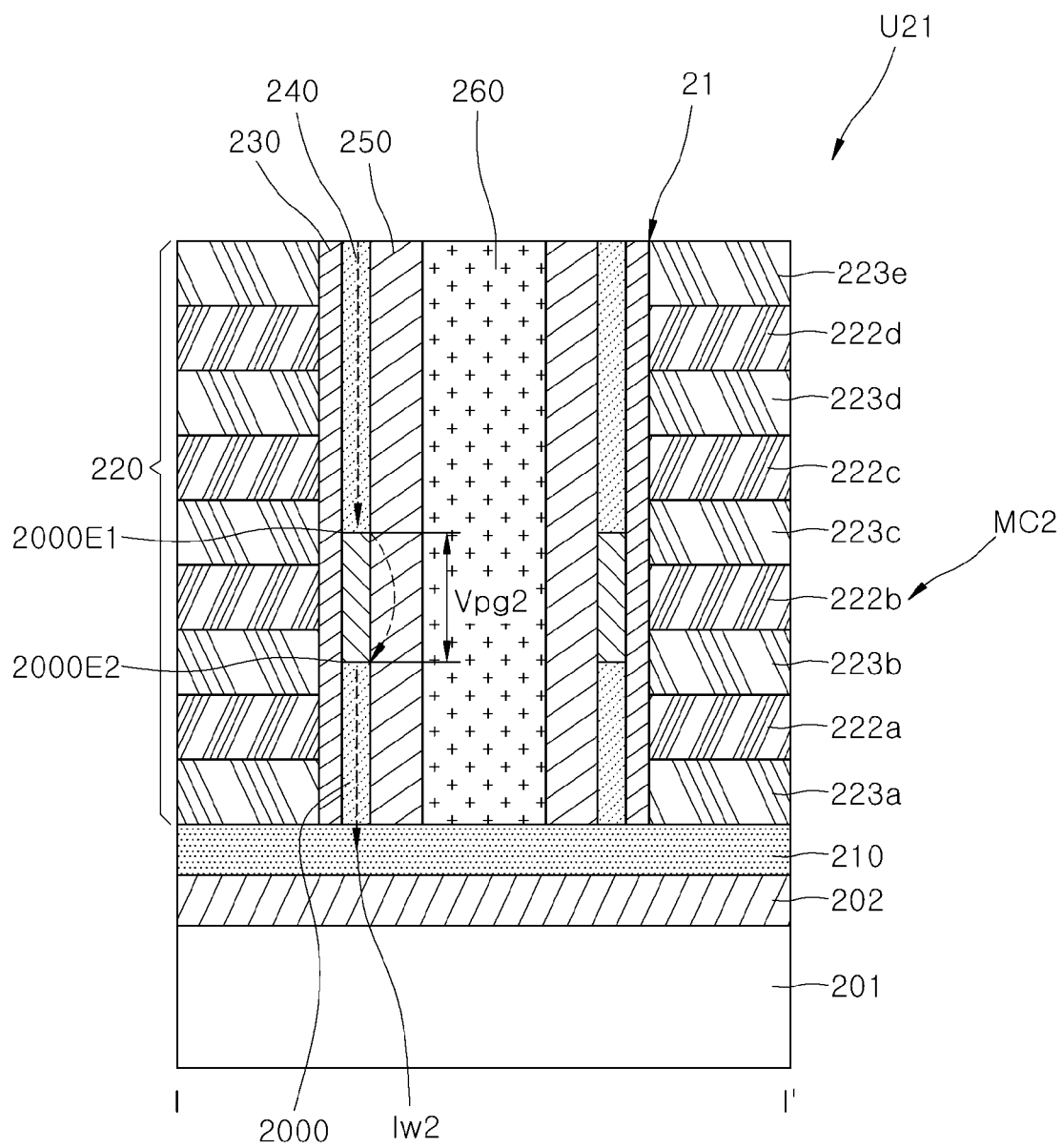
Figure 8A:
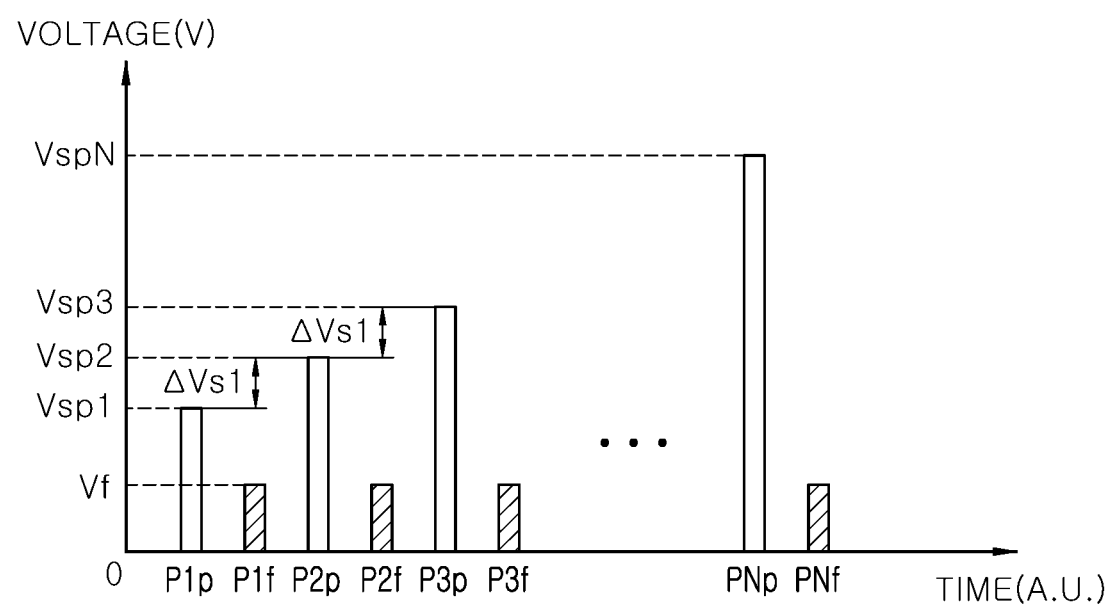
FIGS. 8A and 8B are views schematically illustrating program voltages according to an embodiment of the present disclosure.
Figure 8B:
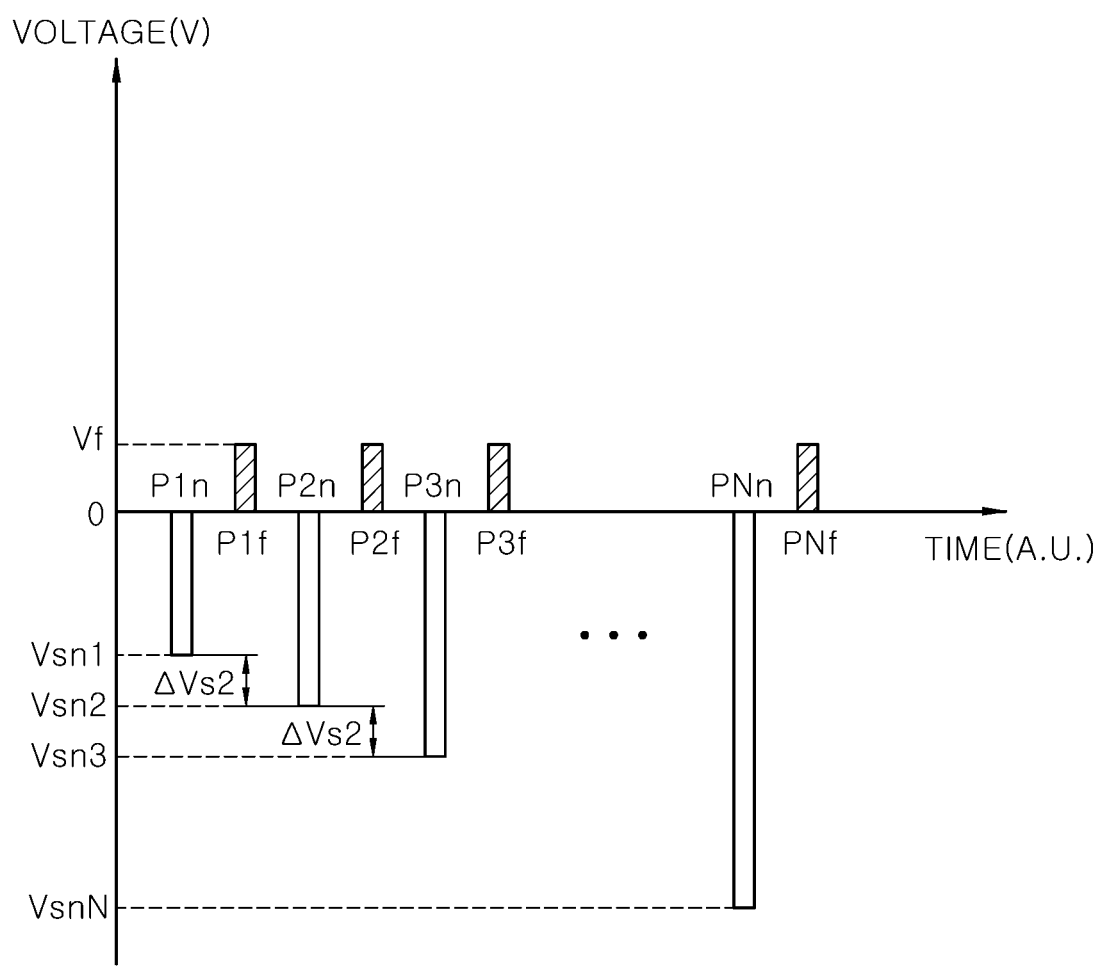

FIG. 4 is a flowchart schematically illustrating a program operation of a nonvolatile memory device according to an embodiment of the present disclosure. FIG. 5 is a view illustrating an example of signal information stored in a nonvolatile memory device by a program operation according to an embodiment of the present disclosure. FIGS. 6A and 6B are views schematically illustrating a read operation of a nonvolatile memory device according to an embodiment of the present disclosure. FIGS. 7A and 7B are views schematically illustrating a program operation of a nonvolatile memory device according to an embodiment of the present disclosure. FIGS. 8A and 8B are views schematically illustrating program voltages according to an embodiment of the present disclosure.

A method of programming a nonvolatile memory device, as illustrated in FIG. 4, may be used to program the memory cells MC1, MC2, MC3, and MC4 of the nonvolatile memory device 1 of FIG. 1 and the memory cells MC1, MC2, MC3, and MC4 of the nonvolatile memory device 2 of FIGS. 2 and 3.

Referring to step S10 of FIG. 4, a memory element including a plurality of memory cells may be provided. Each of the plurality of memory cells may include a transistor device and a reversible resistance device.

In an embodiment, referring to FIG. 1, a memory element may include the first to fourth memory cells MC1, MC2, MC3, and MC4 connected in series with each other between the bit line BL and the source line SL. The first to fourth memory cells MC1, MC2, MC3, and MC4 may include first to fourth transistors TR1, TR2, TR3, and TR4 and first to fourth reversible resistance devices VRa, VRb, VRc, and VRd, respectively. In an embodiment, referring to FIGS. 2 and 3, the first to fourth memory cells MC1, MC2, MC3, and MC4 may share a channel layer 240 and a reversible resistance memory layer 250 that each extends in a direction perpendicular to an upper surface of the substrate 201 (e.g., a vertical direction). Each of the first to fourth memory cells MC1, MC2, MC3, and MC4 may include a portion of the reversible resistance memory layer 250 disposed adjacent to the channel layer 240 and disposed to overlap respectively to first to fourth gate electrode layers 222a, 222b, 222c, and 222d in the vertical direction. The portions of the reversible resistance memory layer 250 may correspond to the first to fourth reversible resistance devices VRa, VRb, VRc, and VRd in FIG. 1. In addition, the first to fourth memory cells MC1, MC2, MC3, and MC4 may include portions of the gate insulating layers 230 disposed adjacent to the channel layer 240 and disposed to overlap respectively to first to fourth gate electrode layers 222a, 222b, 222c, and 222d in the vertical direction. The first to fourth gate electrode layers 222a, 222b, 222c, and 222d and the portions of the gate insulating layers 230 may constitute the first to fourth transistors TR1, TR2, TR3, and TR4 of FIG. 1, respectively.

Referring to step S11 of FIG. 4, a target memory cell to be programmed may be selected from among the plurality of memory cells. In the following description, an embodiment will be described in which the second memory cell MC2 from among the first to fourth memory cells MC1, MC2, MC3, and MC4 illustrated in FIGS. 1, 2, and 3 is selected as the target memory cell. In other embodiments, substantially the same programming methods may be applied when the first memory cell MC1, the third memory cell MC3, or the fourth memory cell MC4 is selected as the target memory cell.

Referring to step S12 of FIG. 4, a target resistance state of the target memory cell may be determined. That is, a target resistance state may be selected as signal information to be written in the reversible resistance device of the target memory cell. In an embodiment, one of two different electrical resistance states corresponding to 1 bit of signal information may be maintained in the reversible resistance device as the signal information. In other embodiments, one of a plurality of different electrical resistance states corresponding to signal information of 2 bits or more may be maintained in the reversible resistance device as the signal information.

FIG. 5 illustrates an example of signal information that can be selected in step S12 as a target resistance state to be written in the reversible resistance device. Referring to FIG. 5, in an embodiment, when the second memory cell MC2, which is the target memory cell, stores 3 bits of signal information, the second memory cell MC2 may have one of first to eighth resistance states R1, R2, R3, R4, R5, R6, R7, and R8 that are different from each other. The first to eighth resistance states R1, R2, R3, R4, R5, R6, R7, and R8 may be distinguished from each other using first to seventh reference resistances Rv1, Rv2, Rv3, Rv4, Rv5, Rv6, and Rv7, respectively. Each of the first to eighth resistance states R1, R2, R3, R4, R5, R6, R7, and R8 may have a resistance distribution. As an example, the resistance value of the fifth resistance state R5 may be distributed between the fourth reference resistance Rv4 and the fifth reference resistance Rv5. In this case, a distribution probability may be highest at an intermediate value between the fourth reference resistance Rv4 and the fifth reference resistance Rv5, and may be lowest at a boundary value adjacent to the fourth or fifth reference resistances Rv4 and Rv5. Other resistance states other than the fifth resistance state may have the same or substantially similar shapes of resistance distribution. In step S12 of FIG. 4, one of the first to eighth resistance states R1, R2, R3, R4, R5, R6, R7, and R8 may be determined as the target resistance state to be written in the reversible resistance device of the second memory cell MC2.

Referring to step S13 of FIG. 4, a resistance state of the target memory cell may be read. That is, the resistance state stored or maintained in the reversible resistance device of the target memory cell may be read. In an embodiment, step S13 may be described using the circuit diagram of FIG. 6A and the structure diagram of FIG. 6B.

Referring to FIG. 6A, the first transistor device TR1, the third transistor device TR3, and the fourth transistor device TR4 of the first memory cell MC1, the third memory cell MC3, and the fourth memory cell MC4, respectively, may be turned on to form a first conductive channel ch1, a third conductive channel ch3, and a fourth conductive channel ch4. At this time, the second transistor device TR2 of the second memory cell MC2, which is a target memory cell, may be turned off. As an example, in order to turn on the first transistor device TR1, the third transistor device TR3, and the fourth transistor device TR4, a pass voltage having a magnitude greater than or equal to a threshold voltage may be applied to the first gate electrode G1, the third gate electrode G3, and the fourth gate electrode G4. A voltage of 0V or a voltage lower than the threshold voltage may be applied to the second gate electrode G2 of the second transistor device TR2.

Subsequently, a read voltage may be applied between the bit line BL and the source line SL to measure an operation current Ir1 passing through the first to fourth memory cells MC1, MC2, MC3, and MC4. The read voltage may have a magnitude that does not change the resistance states stored or maintained in the first to fourth reversible resistance devices VR1, VR2, VR3, and VR4 of the first to fourth memory cells MC1, MC2, MC3, and MC4.

Referring again to FIG. 6A, when the operation current Ir1 passes through the first memory cell MC1, the third memory cell MC3, and the fourth memory cell MC4, the operation current Ir1 may flow along the first conductive channel ch1, the third conductive channel ch3, and the fourth conductive channel ch4. Because a conductive channel is not formed in the second transistor device TR2 of the second memory cell MC2, the operation current Ir1 may flow along the second reversible resistance device VRb when passing through the second memory cell MC2. By calculating a resistance of the second reversible resistance device VRb based on the operation current Ir1 that is measured, the current that reflects the resistance state of the second memory cell MC2 may be read or determined.

Referring to FIG. 6B, a pass voltage having a magnitude greater than or equal to a threshold voltage may be applied to the first gate electrode layer 222a, the third gate electrode layer 222c, and the fourth gate electrode layer 222d. Accordingly, a conductive channel 2000 may be formed in portions of the channel layer 240 electrically controlled by the first gate electrode layer 222a, the third gate electrode layer 222c, and the fourth gate electrode layer 222d. By applying a voltage of 0V or a voltage lower than the threshold voltage to the second gate electrode layer 222b, a conductive channel is not formed in a portion of the channel layer 240 electrically controlled by the second gate electrode layer 222b. Accordingly, the conductive channel 2000 may be disconnected within the portion of the channel layer 240 belonging to the second memory cell MC2.

Subsequently, a read voltage may be applied between upper and lower ends of the channel layer 240, and an operation current Ir2 may be measured. As an example, the read voltage may be applied between the channel lower contact layer 210 and the channel upper contact layer (not illustrated). The channel upper contact layer may be disposed to contact the channel layer 240 over the fifth interlayer insulating layer 223e. The operation current Ir2 may flow along the conductive channel 2000 of the channel layer 240. However, the conductive channel 2000 is disconnected at the portion of the channel layer 240 belonging to the second memory cell MC2, so the operation current Ir2 may flow through the reversible resistance memory layer 250 between both ends 2000E1 and 2000E2 of the conductive channel 2000. By calculating the resistance between the disconnected ends 2000E1 and 2000E2 of the conductive channel 2000 using the measured operation current Ir2, a resistance state of the second memory cell MC2 may be read or determined.

Referring to step S14 of FIG. 4, a read resistance state of the target memory cell may be compared with the target resistance state. The step S14 may include steps S141 and S142, which are performed sequentially. First, referring to step S141 of FIG. 4, it may be determined whether the read resistance state of the target memory cell is the same as the target resistance state. When the read resistance state of the target memory cell is the same as the target resistance state, the target memory cell may maintain the read resistance state and the program operation for the target memory cell may be terminated. If the read resistance state of the target memory cell and the target resistance state are not the same, the process may move to step S142.

Referring to step S142 of FIG. 4, when the read resistance state of the target memory cell is higher than the target resistance state, the process may move to step S15 to perform a positive program operation on the target memory cell. The positive program operation may be an operation that converts or alters an existing resistance state of the reversible resistance device of the target memory cell into the target resistance state by reducing a resistance of the reversible resistance device of the target memory cell. Conversely, when the read resistance state of the target memory cell is lower than the target resistance state, the process may move to step S16 to perform a negative program operation on the target memory cell. The negative program operation may be an operation that converts or changes an existing resistance state of the reversible resistance device of the target memory cell into the target resistance state by increasing a resistance of the reversible resistance device of the target memory cell.

In an embodiment, referring to FIGS. 4, 5 and 6A, when a read resistance state Ri of the second memory cell MC2, which is the target memory cell, is a fifth resistance state R5 and the target resistance state Rf1 is a third resistance state R3, a positive program operation may be performed in step S15. In another embodiment, when a read resistance state Ri of the second memory cell MC2, which is the target memory cell, is the fifth resistance state R5 and the target resistance state Rf2 is a seventh resistance state R7, a negative program operation may be performed in step S16.

Hereinafter, the positive program operation and the negative program operation for the second memory cell MC2 will be described in detail with reference to FIGS. 7A and 7B.

Referring to FIG. 7A, a first transistor device TR1, a third transistor device TR3, and a fourth transistor device TR4 of a first memory cell MC1, a third memory cell MC3, and a fourth memory cell MC4, respectively, may be turned on to form a first conductive channel ch1, a third conductive channel ch3, and a fourth conductive channel ch4, respectively. At this time, the second transistor device TR2 of the second memory cell MC2, which is a target memory cell, may be turned off. As an example, in order to turn on the first transistor device TR1, the third transistor device TR3, and the fourth transistor device TR4, a pass voltage having a magnitude greater than or equal to a threshold voltage may be applied to a first gate electrode G1, a third gate electrode G3, and a fourth gate electrode G4. A voltage of 0V or a voltage that is lower than the threshold voltage may be applied to a second gate electrode G2 of the second transistor device TR2.

Subsequently, a write voltage may be applied between a bit line BL and a source line SL. In an embodiment, when a positive program operation is performed, a voltage of 0V may be applied to the source line SL and a write voltage having a positive polarity may be applied to the bit line BL. In another embodiment, when a negative program operation is performed, a voltage of 0V may be applied to the source line SL, and a write voltage having a negative polarity may be applied to the bit line BL.

In an example of a positive program operation, an operation current Iw1 generated by a write voltage having a positive polarity may flow through the first to fourth memory cells MC1, MC2, MC3, and MC4. When the operation current Iw1 passes through the first memory cell MC1, the third memory cell MC3, and the fourth memory cell MC4, the operation current Iw1 may flow along the first conductive channel ch1, the third conductive channel ch3, and the fourth conductive channel ch4. Because a conductive channel is not formed in the second transistor device TR2 of the second memory cell MC2, the operation current Iw1 may flow along the second reversible resistance device VRb when passing through the second memory cell MC2. Accordingly, when the write voltage is applied, a program voltage Vpg1 having a positive polarity may be applied to both ends of the second reversible resistance device VRb of the second memory cell MC2. In this case, the polarity of the program voltage Vpg1 may follow the polarity of the write voltage. The program voltage Vpg1 may change the electrical resistance of the second reversible resistance device VRb. For example, when the program voltage Vpg1 has a positive polarity, the resistance of the second reversible resistance device VRb may be reduced so that the resistance state of the second reversible resistance device VRb may be converted or changed into a lower resistance state.

In another embodiment, a negative program operation may be performed in which an operation current flows from the source line SL to the bit line BL. When a program voltage Vpg1 having a negative polarity is applied to both ends of the second reversible resistance device VRb of the second memory cell MC2, a resistance of the second reversible resistance device VRb may be increased, so that a resistance state of the second reversible resistance device VRb may be converted into a higher resistance state.

After the write voltage is removed, the second reversible resistance device VRb may retain its revised electrical resistance state in a non-volatile manner. Through the processes described above, a program operation for the second reversible resistance device VRb of the second memory cell MC2 may be performed.

Referring to FIG. 7B, a pass voltage having a magnitude greater than or equal to a threshold voltage may be applied to the first gate electrode layer 222a, the third gate electrode layer 222c, and the fourth gate electrode layer 222d. Accordingly, a conductive channel 2000 may be formed in portions of the channel layer 240 electrically controlled by the first gate electrode layer 222a, the third gate electrode layer 222c, and the fourth gate electrode layer 222d. By applying a voltage of 0V or a voltage lower than the threshold voltage to the second gate electrode layer 222b, a conductive channel is not formed in a portion of the channel layer 240 electrically controlled by the second gate electrode layer 222b. Accordingly, the conductive channel 2000 may be disconnected within the portion of the channel layer 240 belonging to the second memory cell MC2.

Subsequently, a write voltage may be applied between upper and lower ends of the channel layer 240. As an example, the write voltage may be applied between the channel lower contact layer 210 and the channel upper contact layer (not illustrated). The channel upper contact layer may be disposed to contact the channel layer 240 over the fifth interlayer insulating layer 223e.

An operation current Iw2 generated by a write voltage that has a positive polarity may flow along the conductive channel 2000 of the channel layer 240. However, because the conductive channel 2000 is disconnected at the portion of the channel layer 240 belonging to the second memory cell MC2, the operation current Iw2 may flow through the reversible resistance memory layer 250 between the disconnected ends 2000E1 and 2000E2 of the conductive channel 2000. Accordingly, when the write voltage is applied, a program voltage Vpg2 having a positive polarity may be applied to the reversible resistance memory layer 250 between the disconnected ends 2000E1 and 2000E2 of the conductive channel 2000. In this case, the polarity of the program voltage Vpg2 may follow the polarity of the write voltage. The program voltage Vpg2 may change an electrical resistance of the portion of the reversible resistance memory layer 250 belonging to the memory cell MC2. As an example, when a program voltage Vpg2 having a positive polarity is applied, the electrical resistance of the reversible resistance memory layer 250 between the disconnected ends 2000E1 and 2000E2 of the conductive channel 2000 may be reduced, so that the resistance state of the reversible resistance memory layer 250 between the disconnected ends 2000E1 and 2000E2 of the conductive channel 2000 may be converted into a lower resistance state.

In another embodiment, a negative program operation may be performed in which an operation current flows from the channel lower contact layer 210 to the channel upper contact layer. When a program voltage Vpg2 having a negative polarity is applied between the disconnected ends 2000E1 and 2000E2 of the conductive channel 2000, the electrical resistance of the reversible resistance memory layer 250 in that region may be increased, so that the resistance state of the reversible resistance memory layer 250 between the disconnected ends 2000E1 and 2000E2 of the conductive channel 2000 may be changed to a higher resistance state.

After the write voltage is removed, the portion of the second reversible resistance memory layer 250 corresponding to second gate electrode layer 222b may non-volatilely retain the converted electrical resistance state. Through the processes described above, a program operation may be performed on the portion of the reversible resistance memory layer 250 of the second memory cell MC2.

In an embodiment, referring again to FIG. 4, when the operation moves from step S142 to step S15, a positive program operation for a target memory cell may be performed in step S15. In an example with reference to FIG. 5, when the read resistance state Ri of the second memory cell MC2, which is the target memory cell, is a fifth resistance state R5 and the target resistance state Rf1 is a third resistance state R3, the positive program operation may be performed on the second memory cell MC2. In an embodiment, positive program operations in step S15 may be performed through a program loop including first to $N^{th}$ writing steps P1$p$, P2$p$, P3$p$, . . . , and PN$p$ and first to $N^{th}$ verification steps P1$f$, P2$f$, P3$f$, . . . , and PNf as illustrated in FIG. 8A.

Referring again to FIG. 4, step S15 may include steps S151 and S152, which are sequentially performed. In step S151, a program voltage of a positive polarity may be applied to the reversible resistance device of a second memory cell MC2, which is the target memory cell. Specifically, referring to FIG. 8A, a first writing step P1$p$ of converting the resistance state of the reversible resistance device into a third resistance state R3, which corresponds to a target resistance state Rf1, may be performed by applying a first positive program pulse voltage Vsp1 as a program voltage of a positive polarity to the reversible resistance device. In step S152, a first verification step P1$f$ of verifying the first writing step P1$p$ may be performed by applying a verification pulse voltage Vf having a positive polarity illustrated in FIG. 8A to the reversible resistance device of the second memory cell MC2. The first verification step P1$f$ may be a step of verifying whether the resistance state written in the reversible resistance device of the second memory cell MC2 after the first writing step P1$p$ is the same as the target resistance state Rf1.

In step S152, when it is verified that the resistance state of the reversible resistance device of the second memory cell MC2 is the same as the third resistance state R3, which is the target resistance state Rf1, the second memory cell MC2 may maintain the third resistance state R3, and the program operation for the second memory cell MC2 may be terminated. Specifically, if the resistance written in the reversible resistance device of the second memory cell MC2 is a value between the second reference resistance Rv2 and the third reference resistance Rv3 of FIG. 5, then it may be verified that the resistance is the third resistance state R3, and the program operation may be terminated.

On the other hand, when it is verified that the resistance state written in the reversible resistance device of the second memory cell MC2 is not the same as the target resistance state Rf1 in step S152, the process returns to step S142. Instead of comparing a read resistance state with a target resistance state, however, now the resistance state written in the reversible resistance device in step S151 is compared with the target resistance state Rf1 in step S142. According to the comparison result for the resistance states in step S142, a positive program operation may be performed again in step S15, or a negative program operation may be performed in step S16. For example, when the resistance state written in the reversible resistance device of the second memory cell MC2 is higher than the third reference resistance Rv3 of FIG. 5, a positive program operation may be performed again in step S15. When the resistance state written in the reversible resistance device of the second memory cell MC2 is lower than the second reference resistance Rv2 of FIG. 5, a negative program operation may be performed in step S16.

In an embodiment, when a positive program operation is performed again in step S15, a further writing step may be performed on the reversible resistance device of the second memory cell MC2 in step S151. Referring to FIG. 8A, a second writing step P2$p$ may be a step of applying a second positive program pulse voltage Vsp2 having a positive polarity to the reversible resistance device. A magnitude of the second positive program pulse voltage Vsp2 may be greater than a magnitude of the first positive program pulse voltage Vsp1 in the first writing step P1$p$ by a step voltage $\Delta$Vs1.

Subsequently, in step S152, a second verification step P2$f$ is performed in which the verification pulse voltage Vf, illustrated in FIG. 8A, is applied to the reversible resistance device to verify the results of second writing step P2$p$. In the second verification step P2$f$, when it is verified that the resultant resistance state in the reversible resistance device is the same as the target resistance state Rf1, the program operation for the second memory cell MC2 may be terminated. However, if in the second verification step P2$f$ it is verified that the resistance state written in the reversible resistance device is not the same as the target resistance state Rf1, then the process may return to step S142 again.

The loop between S15 and S142 may be repeated. Referring to FIG. 8A, when the resistance state written in the second memory cell MC2 is continuously greater than the target resistance state Rf1, additional positive writing steps P3$p$, . . . , and PN$p$ may be performed by applying positive program pulse voltages Vsp3, . . . , and VspN. Each subsequent positive program pulse voltage may be incremented by the step voltage $\Delta$Vs1, and each resulting change to the written resistance state can be verified by verification steps P3$f$, . . . , and PNf, respectively. The positive writing steps P3$p$, . . . , and PN$p$ and the verification steps P3$f$, . . . , and PNf may be repeated until the resistance state written in the second memory cell MC2 is the same as the target resistance state Rf1, or until the resistance state written in the second memory cell MC2 is lower than the target resistance state Rf1. For example, in the process of sequentially performing the positive writing steps P3$p$, . . . , and PN$p$, when the resistance state written in the second memory cell MC2 corresponds to the third resistance state R3, which is the target resistance state Rf1 of FIG. 5, the program operation may be terminated. In another example, in the process of sequentially performing the positive writing steps P3$p$, . . . , and PN$p$ of FIG. 8A, when the resistance state written in the second memory cell MC2 is lower than the third resistance state R3, which is the target resistance state Rf1 of FIG. 5, the process may move to step S16 and a negative program operation may be performed.

In an embodiment, a magnitude of the step voltage $\Delta$Vs1 may be determined before the first writing step P1$p$ of FIG. 8A is performed in step S151. In another embodiment, the magnitude of the step voltage $\Delta$Vs1 may be determined based on the result of the first verification step P1$f$ in step S152.

In another embodiment, referring again to FIG. 4, when proceeding from step S142 to step S16, a negative program operation for a target memory cell may be performed in step S16. In an example with reference to FIG. 5, when the read resistance state Ri of the second memory cell MC2, which is the target memory cell, is a fifth resistance state R5 and the target resistance state Rf2 is a seventh resistance state R7, the negative program operation may be performed on the second memory cell MC2. In an embodiment, negative program operations in step S16 may be performed through a program loop including first to $N^{th}$ writing steps P1$n$, P2$n$, P3$n$, . . . , and PN$n$ and first to $N^{th}$ verification steps P1$f$, P2$f$, P3$f$, . . . , and PNf as illustrated in FIG. 8B.

Step S16 may include steps S161 and S162, which are sequentially performed. In step S161, a program voltage of a negative polarity may be applied to the reversible resistance device of a second memory cell MC2, which is the target memory cell. Specifically, referring to FIG. 8B, a first writing step P1n of converting the resistance state of the reversible resistance device into a seventh resistance state R7, which corresponds to a target resistance state Rf2, may be performed by applying a first negative program pulse voltage Vsn1 as a negative program voltage to the reversible resistance device. In step S162, a first verification step P1f of verifying the first writing step P1n may be performed by applying a verification pulse voltage Vf having a positive polarity illustrated in FIG. 8B to the reversible resistance device of the second memory cell MC2. The first verification step P1f may be a step of verifying whether the resistance state written in the reversible resistance device of the second memory cell MC2 after the first writing step P1n is the same as the target resistance state Rf2.

In step S162, when it is verified that the resistance state of the reversible resistance device of the second memory cell MC2 is the same as the seventh resistance state R7, which is the target resistance state Rf2, the second memory cell MC2 may maintain the seventh resistance state R7, and the program operation for the second memory cell MC2 may be terminated. Specifically, if the resistance state written in the reversible resistance device of the second memory cell MC2 is a value between the sixth reference resistance Rv6 and the seventh reference resistance Rv7 of FIG. 5, then it may be verified that the resistance state is the seventh resistance state R7, and the program operation may be terminated.

On the other hand, when it is verified that the resistance state written in the reversible resistance device of the second memory cell MC2 is not the same as the target resistance state Rf2 in step S162, the process returns to step S142. Instead of comparing a read resistance state with a target resistance state, however, now the resistance state written in the reversible resistance device in step S161 is compared to the target resistance state Rf2 in step S142. According to the comparison result of the resistance state in step S142, a negative program operation may be performed again in step S16, or a positive program operation may be performed in step S15. For example, when the resistance state written in the reversible resistance device of the second memory cell MC2 is lower than the sixth reference resistance Rv6, a negative program operation may be performed again in step S16. When the resistance state written in the reversible resistance device of the second memory cell MC2 is higher than the seventh reference resistance Rv7 in FIG. 5, a positive program operation may be performed in step S15.

In an embodiment, when a negative program operation is performed again in step S16, a further writing step may be performed for the reversible resistance device of the second memory cell MC2 in step S161. Referring to FIG. 8B, a second writing step may be a step P2n of applying a second negative program pulse voltage Vsn2 having a negative polarity to the reversible resistance device. A magnitude of the second negative program pulse voltage Vsn2 may be greater than a magnitude of the first negative program pulse voltage Vsn1 in the first writing step P1n by a step voltage ΔVs2.

Subsequently, in step S162, a second verification step P2f of applying the verification pulse voltage Vf, as illustrated in FIG. 8B, to the reversible resistance device may be performed to verify the results of second writing step P2n. In the second verification step P2f, when it is verified that the resultant resistance state in the reversible resistance device is the same as the target resistance state Rf2, the program operation for the second memory cell MC2 may be terminated. However, if in the second verification step P2f, it is verified that the resistance state written in the reversible resistance device is not the same as the target resistance state Rf2, then the process may return to step S142.

The loop between S16 and S142 may be repeated. Referring to FIG. 8B, when the resistance state written in the second memory cell MC2 is continuously lower than the target resistance state Rf2, additional negative writing steps P3n, . . . , and PNn may be performed by applying negative program voltages Vsn3, . . . , and VsnN. Each subsequent negative program pulse voltage may be incremented by the step voltage ΔVs2, and each resulting change to the written resistance state can be verified by verification steps P3f, . . . , and PNf, respectively. The negative writing steps P3n, . . . , and PNn and the verification steps P3f, . . . , and PNf, respectively, may be repeated while increasing the magnitude of the pulse voltage by the step voltage ΔVs2 in each cycle. The negative writing steps P3n, P4n, . . . , and PNn may be repeated until the resistance state written in the second memory cell MC2 is the same as the target resistance state Rf2, or until the resistance state written in the second memory cell MC2 is higher than the target resistance state Rf2. For example, when the resistance state written in the second memory cell MC2 is higher than the seventh resistance state R7, which is the target resistance state Rf2, the process may move to step S15 to perform a positive program operation.

In an embodiment, a magnitude of the step voltage ΔVs2 may be determined before the first writing step P1n of FIG. 8B is performed in step S161. In another embodiment, the magnitude of the step voltage ΔVs2 may be determined based on the result of the first verification step P1f in step S162.

As described above, by performing the steps according to the flowchart of FIG. 4, methods of operation of nonvolatile memory devices according to embodiments of the present disclosure may be performed.

As described above, the program loop of FIG. 8A is provided for the positive program operation of step S15 of FIG. 4, and the program loop of FIG. 8B is provided for the negative program operation of step S16 of FIG. 4, but the present disclosure is not necessarily limited thereto. Specifically, in the program loop of FIG. 8A, the first to $N^{th}$ positive program voltages Vsp1, Vsp2, Vsp3, . . . , and VspN are sequentially increased by a constant step voltage ΔVs1, but in some embodiments, the first to $N^{th}$ positive program voltages Vsp1, Vsp2, Vsp3, . . . , and VspN might not be necessarily increased sequentially by a constant voltage level. Similarly, in the program loop of FIG. 8B, the first to $N^{th}$ negative program voltages Vsn1, Vsn2, Vsn3, . . . , and VsnN are sequentially increased by the constant step voltage ΔVs2, but in some embodiments, the first to $N^{th}$ negative program voltages Vsn1, Vsn2, Vsn3, . . . , and VsnN might not be necessarily increased sequentially by a constant voltage level.

When a program operation is repeatedly performed for one of a plurality of memory cells each having a reversible resistance device according to an embodiment of the present disclosure, an erase operation similar to that of a conventional flash memory device might not be requested. That is, in a conventional flash memory device, when a second program operation is performed on a memory cell for which a first program operation has been completed, an erase operation of erasing electrons stored in a charge storage layer of the memory cell by the first program operation is performed in between operations. The second program operation may be performed on the memory cell for which an erase operation has been completed. In contrast, in a nonvolatile memory device including a reversible resistance device according to an embodiment of the present disclosure, the resistance state of the reversible resistance device in the memory cell may be directly converted from a current resistance state into a target resistance state, which can be one of multi-level resistance states. Accordingly, it is possible to improve the programming speed of signal information for the memory cell by avoiding a separate erase operation.

In addition, in the programming method of a nonvolatile memory device according to an embodiment of the present disclosure, when performing a positive or negative program operation, a program loop including a plurality of writing steps and a plurality of verification steps may be applied. Accordingly, when the signal information is stored, it is possible to control the signal level more precisely, so that the program operation may be reliably performed.

A nonvolatile memory device according to various embodiments of the present disclosure may have a cell structure similar to a conventional NAND flash memory device. As an example, the nonvolatile memory device may include a plurality of strings S including first to fourth memory cells MC1, MC2, MC3, and MC4 as illustrated in FIG. 1. An end of each of the plurality of strings S may be connected to a common bit line BL, and the other end of each of the plurality of strings S may be connected to a common source line SL. In this way, the nonvolatile memory device may include a memory block including a plurality of strings S.

In addition, first gate electrodes G1 of first memory cells MC1 of the plurality of strings S are connected to each other, so that the plurality of first memory cells MC1 may constitute a first page. In the same manner, a plurality of second memory cells MC2, a plurality of third memory cells MC3, and a plurality of fourth memory cells MC4 may constitute a second page, a third page, and a fourth page, respectively.

In the case of a nonvolatile memory device according to an embodiment of the present disclosure, in the cell structure described above, a positive program operation, a negative program operation, and a read operation may be performed in a random access method in units of cells. In contrast, in the case of the conventional NAND flash memory device, an erase operation may be performed in units of memory blocks, and a program operation and a read operation may be performed in units of pages. Accordingly, nonvolatile memory devices according to embodiments of the present disclosure may have an increased storage capacity for cell signal information that results from the disclosed methods of operation.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of programming a nonvolatile memory device, comprising:
providing a memory element including a plurality of memory cells, each of the plurality of memory cells including a reversible resistance device;
selecting a target memory cell from among the plurality of memory cells;
determining a target resistance state for the reversible resistance device of the target memory cell;
reading a resistance state of the reversible resistance device of the target memory cell;
comparing the read resistance state with the target resistance state; and
performing one of a positive program operation and a negative program operation for the reversible resistance device of the target memory cell when the read resistance state is different from the target resistance state,
wherein the positive program operation includes applying a program voltage having a positive polarity to the reversible resistance device of the target memory cell, and the negative program operation includes applying a program voltage having a negative polarity to the reversible resistance device of the target memory cell.

2. The method of claim 1, further comprising terminating the positive program operation or the negative program operation for the reversible resistance device of the target memory cell when the read resistance state and the target resistance state are the same.

3. The method of claim 1,
wherein the positive program operation reduces a resistance of the reversible resistance device of the target memory cell when the read resistance state is higher than the target resistance state, and
wherein the positive program operation comprises a first writing step of applying a first positive program pulse voltage of a positive polarity to the reversible resistance device and a first verification step of applying a verification pulse voltage of a positive polarity to the reversible resistance device to verify the first writing step.

4. The method of claim 3, wherein the positive program operation further comprises:
a second writing step of applying a second positive program pulse voltage of a positive polarity greater than the first program pulse voltage by a step voltage to the reversible resistance device when the first verification step determines that a resistance state of the reversible resistance device is higher than the target resistance state; and
a second verification step of applying the verification pulse voltage to the reversible resistance device to verify the second writing step.

5. The method of claim 3, wherein the positive program operation is terminated when the first verification step determines that a resistance state of the reversible resistance device corresponds to the target resistance state.

6. The method of claim 3, further comprising performing the negative program operation for the reversible resistance device when the first verification step determines that a resistance state of the reversible resistance device is lower than the target resistance state.

7. The method of claim 1, wherein the negative program operation increases a resistance of the reversible resistance device of the target memory cell, when the read resistance state is lower than the target resistance state, and
wherein the negative program operation comprises a first writing step of applying a first negative program pulse voltage of a negative polarity to the reversible resistance device and a first verification step of applying a verification pulse voltage of a positive polarity to the reversible resistance device to verify the first writing step.

8. The method of claim 7, wherein the negative program operation further comprises:
a second writing step of applying a second negative program pulse voltage of a negative polarity greater than the first negative program pulse voltage by a step voltage to the reversible resistance device when the first verification step determines that a resistance state of the reversible resistance device is lower than the target resistance state; and a second verification step of applying the verification pulse voltage to the reversible resistance device to verify the second writing step.

9. The method of claim 7, wherein the negative program operation is terminated when the first verification step determines that a resistance state of the reversible resistance device corresponds to the target resistance state.

10. The method of claim 7, further comprising performing the positive program operation for the reversible resistance device when the first verification step determines that a resistance state of the reversible resistance device is higher than the target resistance state.

11. The method of claim 1, wherein the positive program operation and the negative program operation change the resistance state of the reversible resistance device to the target resistance state, which is one of a plurality of resistance states at different levels.

12. The method of claim 1, wherein the memory element comprises:
a substrate;
a channel layer extending in a direction perpendicular to an upper surface of the substrate;
a reversible resistance memory layer disposed to contact the channel layer; and
a plurality of gate electrode layers disposed adjacent to the channel layer and spaced apart from each other along the direction perpendicular to the upper surface of the substrate.

13. A method of programming a nonvolatile memory device, comprising:
providing a memory element including a plurality of memory cells connected in series along a channel layer extending in a direction perpendicular to an upper surface of a substrate, each of the plurality of memory cells including a reversible resistance memory layer and a gate electrode layer that are disposed adjacent to the channel layer;
selecting a target memory cell from among the plurality of memory cells and determining a target resistance state for the reversible resistance memory layer of the target memory cell;
reading a resistance state by measuring an operation current flowing through the reversible resistance memory layer of the target memory cell;
comparing the read resistance state with the target resistance state; and
performing one of a positive program operation and a negative program operation for the reversible resistance memory layer of the target memory cell to change the resistance state of the reversible resistance memory layer when the read resistance state is different from the target resistance state.

14. The method of claim 13, wherein reading the resistance state of the reversible resistance memory layer comprises:
applying a pass voltage to gate electrode layers of non-target memory cells from among the plurality of memory cells to form conductive channels in portions of the channel layer of the non-target memory cells; and
applying a read voltage to upper and lower ends of the channel layer to measure an operation current flowing through the conductive channels of the non-target memory cells and the reversible resistance memory layer of the target memory cell.

15. The method of claim 13, further comprising terminating the program operation for the reversible resistance memory layer of the target memory cell when the read resistance state and the target resistance state are the same.

16. The method of claim 13, wherein the positive program operation of reducing a resistance of the reversible resistance memory layer of the target memory cell is performed when the read resistance state is higher than the target resistance state, and
wherein the positive program operation comprises a first writing step of applying a first positive program pulse voltage of a positive polarity to the reversible resistance memory layer, and a first verification step of applying a verification pulse voltage of a positive polarity to the reversible resistance memory layer to verify the first writing step.

17. The method of claim 16, wherein the positive program operation further comprises a second writing step of applying a second positive program pulse voltage of a positive polarity greater than the first positive program pulse voltage by a step voltage to the reversible resistance memory layer when the first verification step determines that a resistance state of the reversible resistance memory layer is higher than the target resistance state, and a second verification step of applying the verification pulse voltage to the reversible resistance memory layer to verify the second writing step, and
wherein the negative program operation of increasing a resistance of the reversible resistance memory layer is performed when the first verification step determines that a resistance state of the reversible resistance memory layer is lower than the target resistance state.

18. The method of claim 13, wherein the negative program operation of increasing a resistance of the reversible resistance memory layer of the target memory cell is performed when the read resistance state is lower than the target resistance state, and
wherein the negative program operation comprises a first writing step of applying a first negative program pulse voltage of a negative polarity to the reversible resistance memory layer and a first verification step of applying a verification pulse voltage of a positive polarity to the reversible resistance memory layer to verify the first writing step.

19. The method of claim 18, wherein the negative program operation further comprises a second writing step of applying a second negative program pulse voltage of a negative polarity greater than the first negative program pulse voltage by a step voltage to the reversible resistance memory layer when the first verification step determines that a resistance state of the reversible resistance memory layer is lower than the target resistance state, and a second verification step of applying the verification pulse voltage to the reversible resistance memory layer to verify the second writing step, and
wherein the positive program operation of reducing a resistance of the reversible resistance memory layer is performed when the first verification step determines that a resistance of the reversible resistance memory layer is higher than the target resistance state.

20. The programming method of claim 13, wherein performing the positive program operation for the reversible resistance memory layer of the target memory cell comprises:

applying a pass voltage to gate electrode layers of non-target memory cells from among the plurality of memory cells to form conductive channels in portions of the channel layer of the non-target memory cells; and applying a write voltage having a positive polarity to upper and lower ends of the channel layer to change a resistance state of the reversible resistance memory layer of the target memory cell.

21. The programming method of claim 13, wherein performing the negative program operation for the reversible resistance memory layer of the target memory cell comprises:

applying a pass voltage to gate electrode layers of non-target memory cells from among the plurality of memory cells to form conductive channels in the portions of the channel layer of the non-target memory cells; and applying a write voltage having a negative polarity to upper and lower ends of the channel layer to change a resistance state of the reversible resistance memory layer of the target memory cell.

\* \* \* \* \*